(12) United States Patent  
Parker et al.

(10) Patent No.: US 8,907,296 B2
(45) Date of Patent: Dec. 9, 2014

(54) CHARGED PARTICLE BEAM SYSTEM APERTURE

(71) Applicant: FEI Company, Hillsboro, OR (US)

(72) Inventors: N. William Parker, Hillsboro, OR (US); Mark W. Utlaut, Scappoose, OR (US); David William Tuggle, Portland, OR (US); Jeremy Graham, Portland, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/669,626

(22) Filed: Nov. 6, 2012

(65) Prior Publication Data

US 2013/0181140 A1    Jul. 18, 2013

Related U.S. Application Data

(60) Provisional application No. 61/556,690, filed on Nov. 7, 2011.

(51) Int. Cl.
*H01J 3/14* (2006.01)
*H01J 37/09* (2006.01)
*G21K 1/00* (2006.01)

(52) U.S. Cl.
CPC .............. *G21K 1/00* (2013.01); *H01J 2237/045* (2013.01); *H01J 2237/0453* (2013.01); *H01J 37/09* (2013.01)
USPC ..................................................... 250/396 R

(58) Field of Classification Search
CPC ..... H01J 37/3174; H01J 37/045; H01J 37/09; H01J 2237/0453; H01J 2237/31776

USPC ........ 250/396 R, 398, 396 ML, 492.1, 492.2, 250/492.3
See application file for complete search history.

(56) References Cited

U.S. PATENT DOCUMENTS

| 5,899,728 A * | 5/1999 | Mangat et al. ............. 438/459 |
| 6,900,447 B2 | 5/2005 | Gerlach et al. |
| 7,009,187 B2 | 3/2006 | Gerlach et al. |
| 8,076,650 B2 | 12/2011 | Smith et al. |
| 8,168,961 B2 | 5/2012 | Straw et al. |

(Continued)

FOREIGN PATENT DOCUMENTS

| EP | 1587128 | 6/2011 |
| EP | 2590203 | 5/2013 |

(Continued)

OTHER PUBLICATIONS

Ji, Qing, et al., "Ion beam imprinting system for nonfabrication," Microelectronic Engineering, 2006, pp. 796-799, vol. 83.

(Continued)

*Primary Examiner* — Nicole Ippolito
*Assistant Examiner* — Hanway Chang
(74) *Attorney, Agent, or Firm* — Scheinberg & Associates, PC; Michael O. Scheinberg; John E. Hillert

(57) ABSTRACT

An improved beam-defining aperture structure and method for fabrication is realized. An aperture opening is made in a thin conductive film positioned over a cavity in a support substrate, where the aperture size and shape is determined by the opening in the conductive film and not determined by the substrate.

21 Claims, 9 Drawing Sheets

(56) References Cited

U.S. PATENT DOCUMENTS

| | | |
|---|---|---|
| 8,278,220 B2 | 10/2012 | Holtermann et al. |
| 8,283,629 B1 | 10/2012 | Tuggle et al. |
| 8,314,410 B2 | 11/2012 | Straw et al. |
| 8,405,054 B2 | 3/2013 | Smith et al. |
| 2004/0151991 A1 | 8/2004 | Stewart et al. |
| 2005/0104014 A1* | 5/2005 | Gurovich .................. 250/493.1 |
| 2006/0076491 A1 | 4/2006 | Yasuda et al. |
| 2011/0115129 A1 | 5/2011 | Straw et al. |
| 2011/0163068 A1 | 7/2011 | Utlaut et al. |
| 2012/0103945 A1 | 5/2012 | Straw et al. |
| 2012/0200007 A1 | 8/2012 | Straw et al. |

FOREIGN PATENT DOCUMENTS

| | | |
|---|---|---|
| GB | 1509077 | 5/1974 |
| JP | S6081751 | 5/1985 |
| JP | 2008204675 | 9/2008 |

OTHER PUBLICATIONS

Khamsehpour, B., et al., "Drilling of fine apertures in thin metallic foils using a focused ion beam," Vacuum, 1993, pp. 361-365, vol. 44, Nos. 3/4.

* cited by examiner

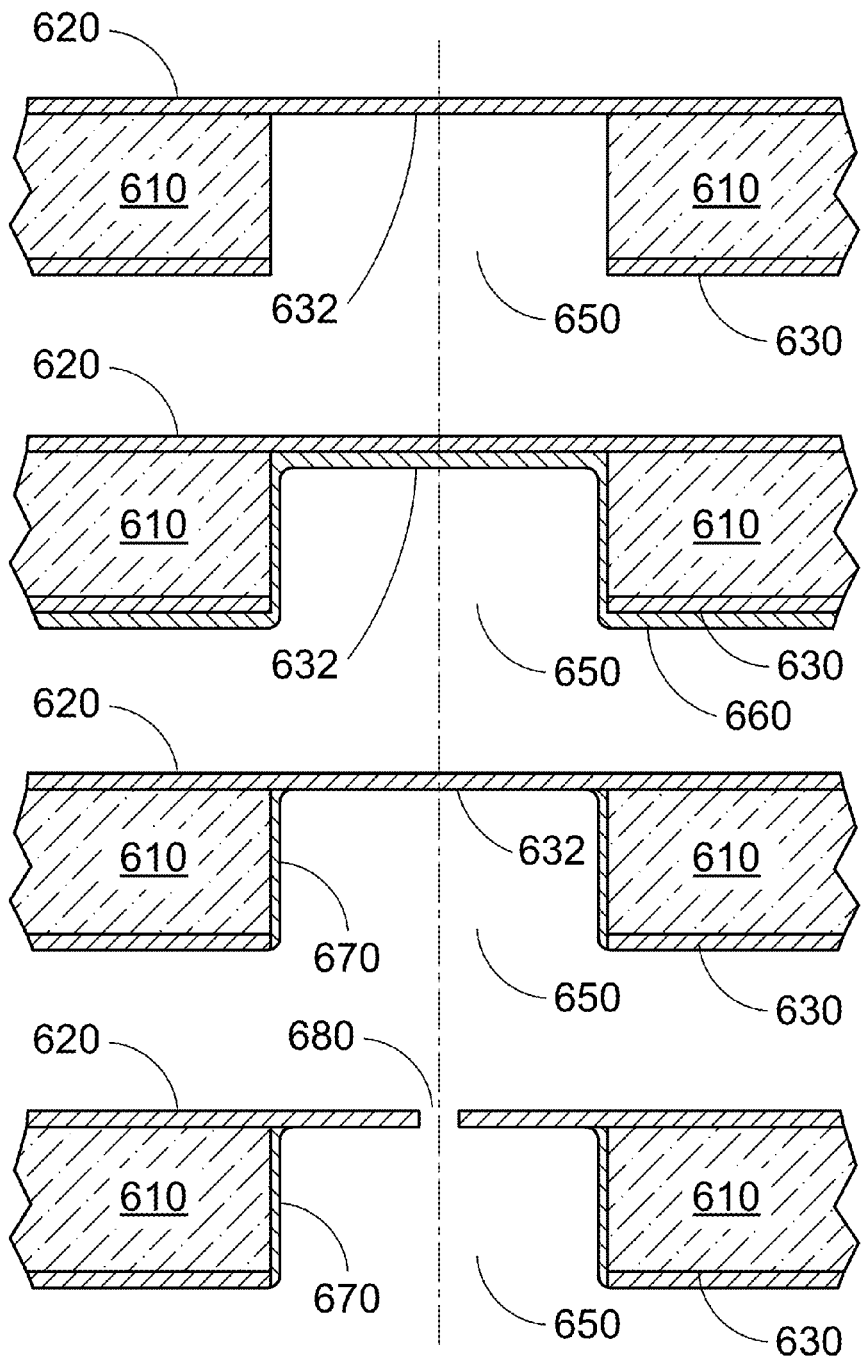

CHARGED PARTICLE BEAM SYSTEM APERTURE

This application claims priority from U.S. Provisional Application 61/556,690, filed Nov. 7, 2011, which is hereby incorporated by reference.

TECHNICAL FIELD OF THE INVENTION

The present invention relates to charged particle beam systems, more specifically, beam-defining apertures in charged particle beam systems.

BACKGROUND OF THE INVENTION

In charged particle beam systems, such as electron microscopes or focused ion beam (FIB) systems, a source generates charged particles which are then focused by an optical column into a beam and directed onto the surface of a target to be imaged and/or processed. In the column, this beam may be blanked, that is, diverted into a stop to turn it off, deflected to move it around on the target surface.

A beam having a lower beam current, that is, fewer charged particles, can typically be focused to a smaller diameter than a beam having a greater current. Using a lower beam current can therefore provide higher resolution imaging or processing. A lower beam current also results in less damage to the target.

An ion beam can be used to mill or sputter material in controlled patterns from the surface of a target. The milling rate is roughly proportional to the beam current. Higher beam currents are therefore preferred when it is desired to quickly remove material, although the higher beam current typically results in lower resolution processing. Processing will sometimes use a two-step processing, with a high current beam to remove material quickly, and then a lower current beam to more precisely complete the milling Although an ideal beam would have all the ions uniformly distributed within a desired beam diameter, in actuality, the beam current distribution is more or less bell-shaped and tapers off away from the beam center. This "tail" reduces image resolution and makes it impossible to mill a straight vertical edge.

Some applications require imaging, coarse milling, and fine milling. In particular, when a milled pattern needs to be precisely located with respect to a pre-existing feature on a target, it is necessary to first image the target with a lower current FIB, and then to switch to a higher current (typically larger diameter) FIB for coarse milling and then a lower current beam for fine milling. One important example of such an imaging/milling process is the preparation of thin "lamellae" (singular: "lamella") of various types of samples, such as semiconductor devices and cryo-frozen biological samples. In the case of semiconductor device failure analysis, a particular region of interest (RoI) within an integrated circuit, usually containing a defective device to be analyzed, is exposed by FIB milling on both sides, leaving a thin slice (lamella) of material remaining which contains the defective device—these lamellae are thin enough for use in high voltage transmission electron microscopes (TEMs) or scanning transmission electron microscopes (STEMs) where atomic resolutions are, in principle, available. Because the lamellae are only tens of nanometers thick, and the defects being observed may be on the scale of nanometers, the milling to create the lamella is extremely precise.

During preparation of a lamella, it is necessary to switch between using large current, large diameter beams suitable for rapid milling, lower current, smaller diameter beam for fine milling, and even lower current, smaller diameter beams imaging. This is typically done by changing a beam-defining aperture (BDA) through which the beam passes. BDAs are typically holes in a metal strip, allowing only charged particles that pass through the hole to form the beam. There are typically several BDAs, or holes, in a metal strip, and switching apertures typically entails moving the strip so that a hole of a different diameter is positioned in the path of the beam.

FIG. 1 is a schematic cross-sectional view of a prior art aperture 100. A hole 110 is formed in a silicon substrate 108 of roughly the size of the desired aperture hole. Layers may be deposited on the silicon substrate such as a $SiO_2$ layer 106 and a $Si_xN_y$ layer 104 to aid in the formation of this hole. A molybdenum layer 102 is then deposited on all surfaces conformally to protect the aperture from the ions in the ion beam. The layer is thin, typically 200-500 nm, to avoid substantially reducing the aperture hole diameter. Beam defining apertures in ion beam systems have a limited life because the ions in the ion beam impinge on the aperture structure, eroding it and expanding the hole.

SUMMARY OF THE INVENTION

An object of the invention is to provide an improved beam defining aperture for charged particle beam systems, including focused ion beam systems, transmission electron microscopes, scanning transmission electron microscopes, and scanning electron microscopes.

The invention comprises new aperture structures and methods for fabricating these structures. A preferred aperture structure includes a deposited film supported by a substrate, where the aperture size and shape is not determined by (i.e., patterned into) the substrate.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIGS. 6A-6H illustrate the processing steps of FIG. 5.

DETAILED DESCRIPTION OF PREFERRED EMBODIMENT

Examination of prior art aperture holes has revealed many irregularities stemming from the methods used to form the aperture holes, including mechanical drilling, laser ablation, FIB-milling, etching, or electrical discharge machining (EDM). These irregularities include large burrs extending outwards from the aperture holes, irregularities in the aperture sidewalls, out-of-roundness and curtaining of the sidewalls (vertical grooves and ridges roughly parallel to the beam axis).

Applicants have investigated the effect of aperture quality on the quality of the charged particle beams. Voids and patch fields observed on the sidewall structure of prior art molybdenum apertures are thought to cause undesirable deflections of charged particles passing through the apertures, especially of charged particles passing near the aperture sidewalls. This deflection causes the virtual source size to be enlarged, thereby making the focused beams at the substrate larger than they would be in the absence of these aperture wall effects.

Figure 1:
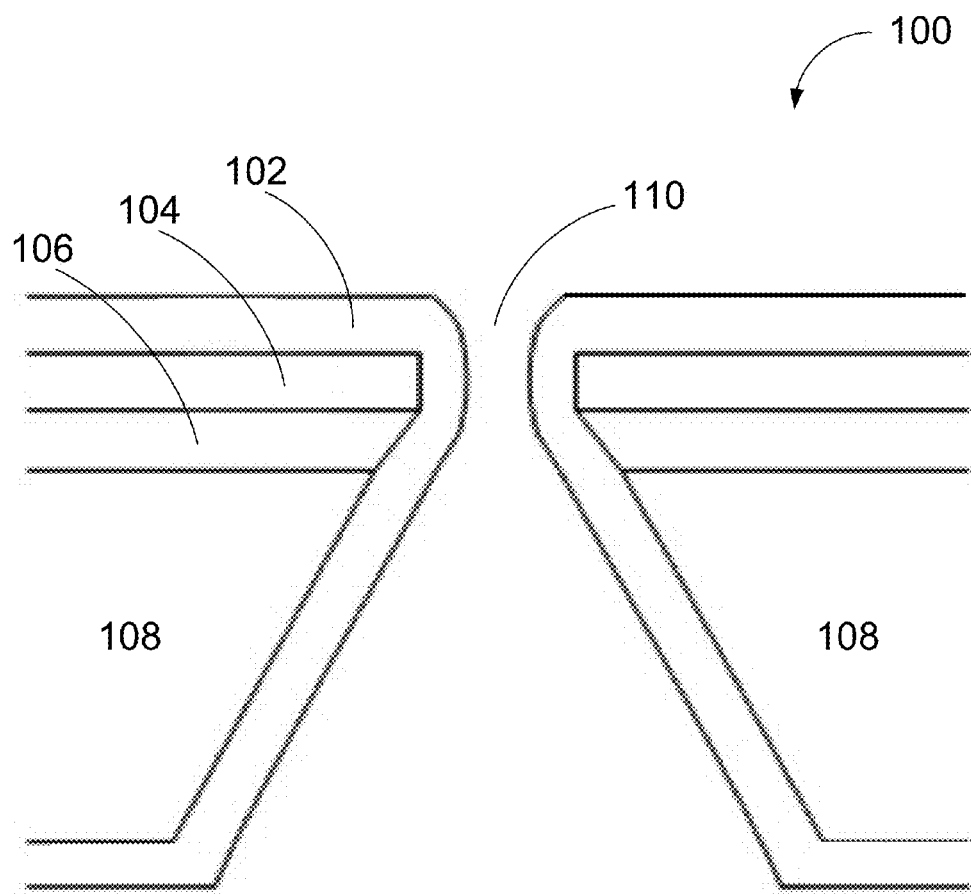
FIG. 1 is a schematic cross-sectional view of a prior art aperture.
Figure 2:
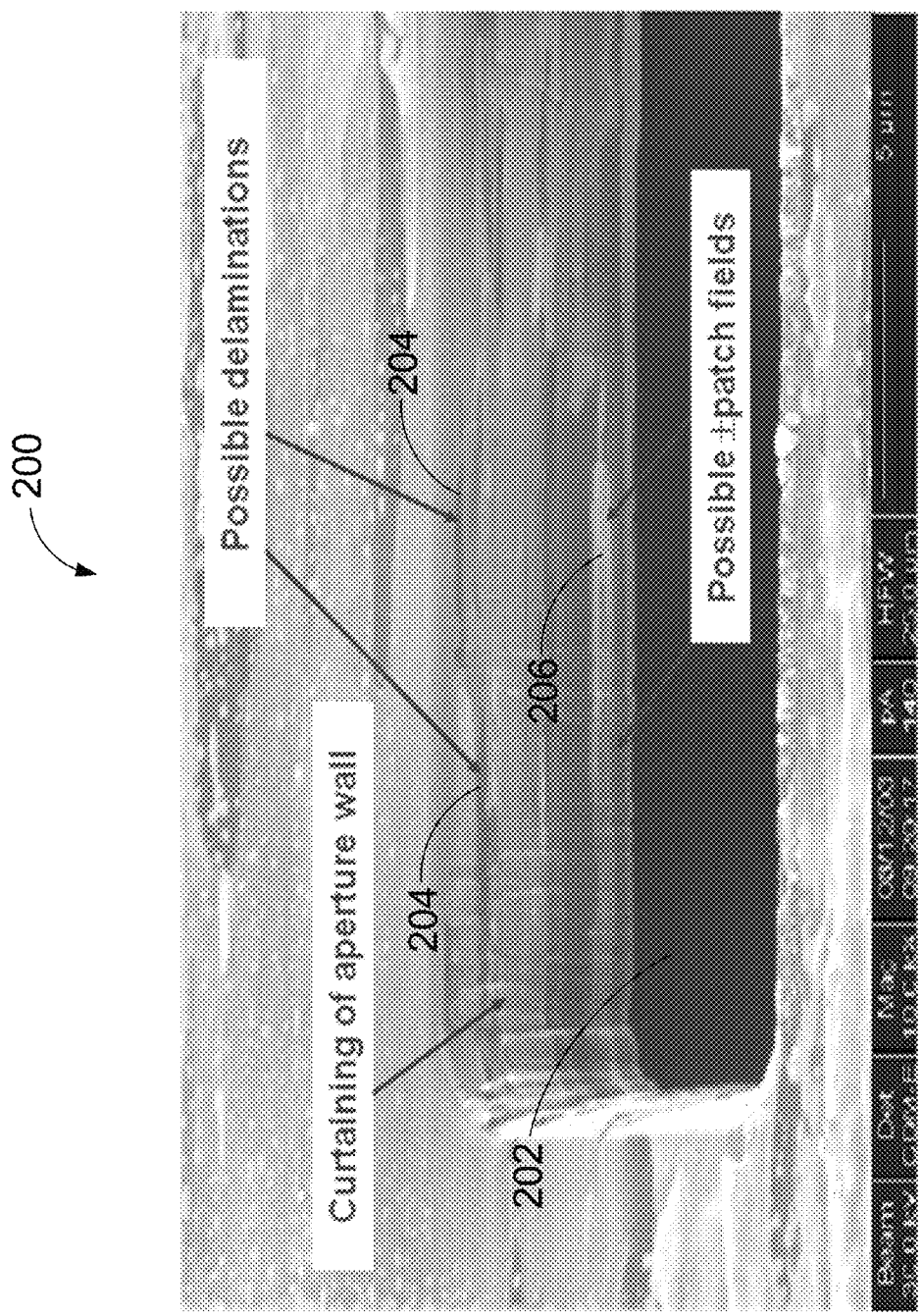
FIG. 2 is a micrograph of a prior art rectangular aperture showing some of the defects typically found in the sidewalls when fabricated using rolled molybdenum sheet metal.

FIG. 2 is a micrograph of a prior art molybdenum aperture 200 (rectangular opening 202 in this example), illustrating various undesirable aspects. This aperture was fabricated from a thin molybdenum sheet, which itself was formed by rolling of sintered molybdenum material. The sintered molybdenum has many microcrystallites and cavities—when rolled, these structures are flattened to form the layered material shown in the sidewall of the aperture. Delaminations 204 are visible, resulting in cavities within the material. The cavities are exposed during the process which creates the aperture hole, resulting in openings in the wall as shown. In addition, "patch fields" 206 with differing work functions are also revealed during the aperture-forming process—these patch fields appear dark or bright in secondary electron imaging as shown. Both the patch fields and cavities may have deleterious effects on charged particle beams passing through the aperture due to induced local perturbations of the electric field within and near the aperture.

Moreover, some prior art methods used to manufacture the aperture structures are expensive. If an aperture strip has a large range of hole diameters, it is typically necessary to form counter-bores or cavities at the locations of the smaller holes to maintain aperture aspect ratios (i.e., the ratios of the length of the hole to the hole diameter) within a range of typically 0.5 to 2.0—forming these counter-bores or cavities further increases the cost of the aperture strip. The holes are typically individually formed (by drilling, laser ablation, FIB-milling, etching, or EDM) and the fabrication process is serial (i.e., one aperture hole is formed at a time).

In the typical prior art fabrication sequence, the aperture hole diameter is determined by the hole 110 etched in the silicon substrate prior to deposition of the molybdenum, not in the deposited molybdenum layer during or after deposition. A disadvantage of this fabrication method is that the molybdenum is necessarily relatively thin to avoid decreasing the final aperture opening size. In a FIB system, where the beam will sputter the aperture material, the thin molybdenum layer will rapidly deteriorate, resulting in short aperture lifetimes.

A preferred embodiment of the invention includes a substrate of a first material and an aperture material different from the substrate material. The portion of the aperture material around the hole is not directly supported by the substrate, that is, the aperture material is cantilevered over a hole in the substrate, like a drum skin over a drum frame. That is, there is a cavity or hole in the substrate under an opening portion of the aperture material. The aperture opening is therefore defined by a hole in the aperture material, not by a hole in the substrate. The patterning of the aperture material therefore determining the aperture opening, not the patterning of the substrate.

Figure 3:
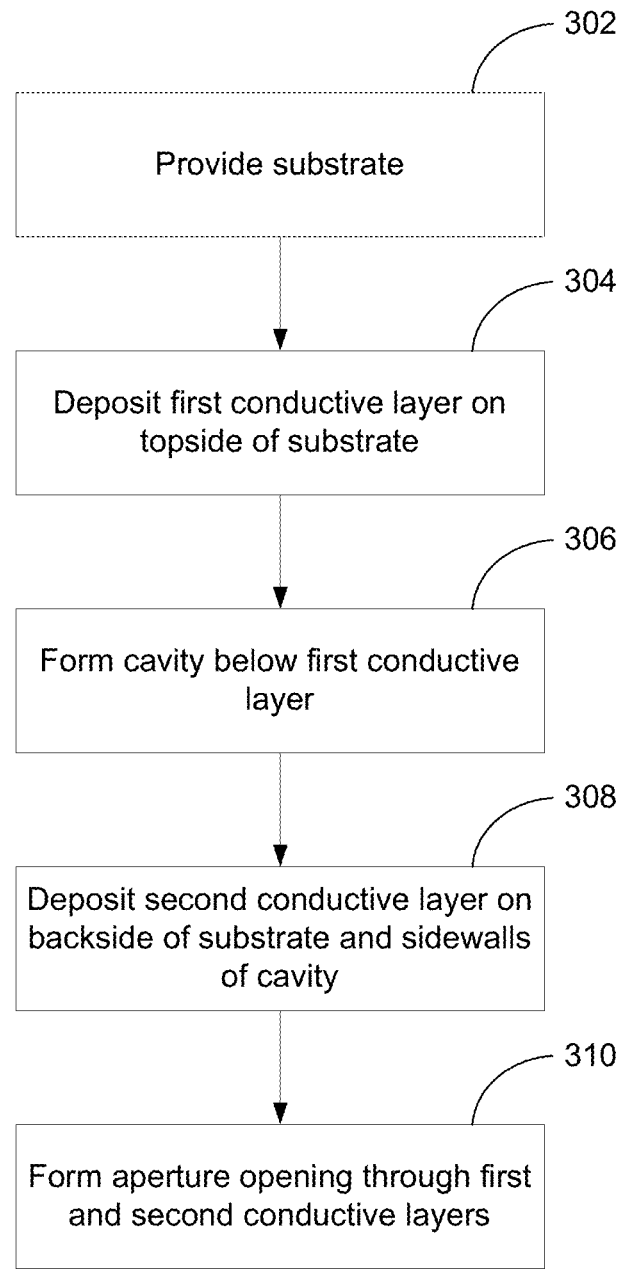
FIG. 3 is a flow chart showing a method of making an aperture.

FIG. 3 is a flowchart showing a first preferred fabrication method of making an aperture structure. FIGS. 4A-4E illustrate the steps of the flowchart in FIG. 3.

Figure 4A:
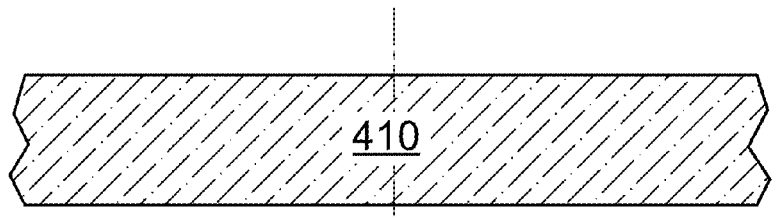
FIGS. 4A-4E illustrate the processing steps of FIG. 3.
Figure 4B:
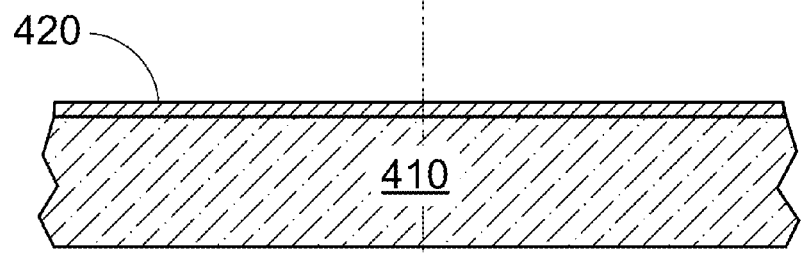

In step 302, a silicon substrate is provided. FIG. 4A shows an initial silicon substrate 410. The silicon substrate is preferably a single crystal semiconductor silicon wafer. Preferably, the silicon wafer is polished on both sides in order to facilitate smooth layer deposition and the eventual mounting of the die to an aperture support. The wafer thickness is not significant, so different wafer diameters may be used.

In step 304, a first conductive coating 420 (FIG. 4B) is deposited onto the top surface of the wafer 410. The first conductive coating is preferably metallic, and more preferably molybdenum. Other metals, such as tungsten, titanium, or platinum, and non-metals, such as graphite or conducting diamond (B-doped) can be used. Conductive coating 420 could be deposited by any known method, such as chemical vapor deposition (CVD), sputtering, or evaporation. A slightly tensile film is preferred to avoid buckling across the counter-bore or cavity opening.

Figure 4C:
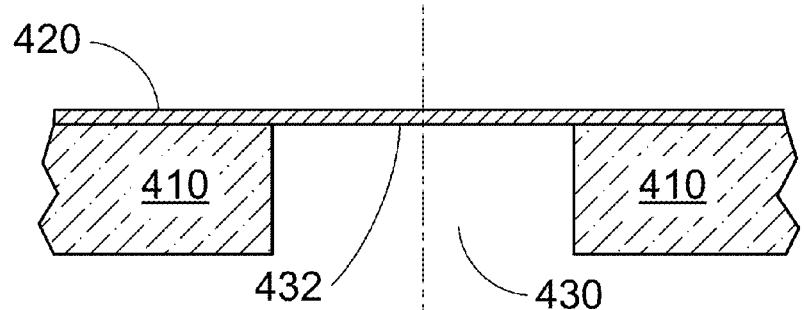

In step 306, the substrate material is removed from a region of substrate 410 to form a cavity 430 below conductive layer 420 and expose the backside of a portion of conductive layer 420 as shown in FIG. 4C. The exposed portion of conductive layer 420 is referred to as the aperture opening defining portion 432. The aperture opening defining portion 432 may be the exposed portion of multiple conductive layers formed as a laminate. The substrate material can be etched, for example, using a deep reactive ion etch (DRIE) process. In some embodiments, the cavity 430 is about 1.0 mm in diameter. For this etch step, the conductive layer 420 serves as an etch stop, thus the substrate etch proceeds to completion, ensuring that the bottom of the cavity 430 is entirely molybdenum. The lithographic patterning step used in the DRIE process is well known and not shown.

Figure 4D:
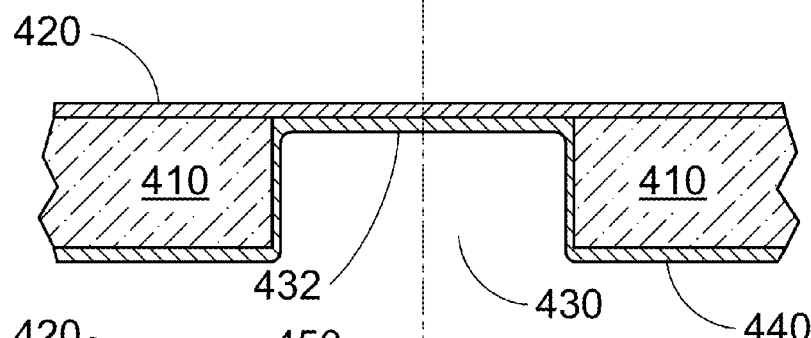

In step 308, a second conductive coating is deposited onto the backside of wafer and onto the exposed backside surface of layer 420, as well as on the sidewalls of cavity 430 as shown in FIG. 4D. The second conductive coating preferably comprises molybdenum, approximately 4 µm to 5 µm thick. Any deposition method could be used, such as the ones described above with respect to depositing conductive layer 420. Again, a slightly tensile film is preferred to avoid buckling of the aperture opening defining region across cavity 430.

Figure 4E:
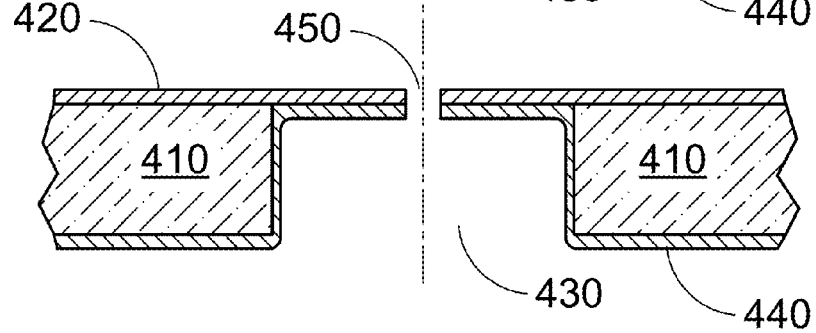

In step 310, an aperture opening 450 is formed through the first and second conductive layers 420 and 440 as shown in FIG. 4E. Aperture opening 450 can be formed, for example, by photolithography or by ion beam milling. The combined thickness of the two conductive layers is preferably between 8 µm and 10 µm in this embodiment. Because the aperture opening is determined by the patterning of the conductive layer, instead of by the patterning of the substrate as in the prior art, the conductive layer can be much thicker, which produces a longer lasting aperture, resistant to ion beam etching.

Figure 5:
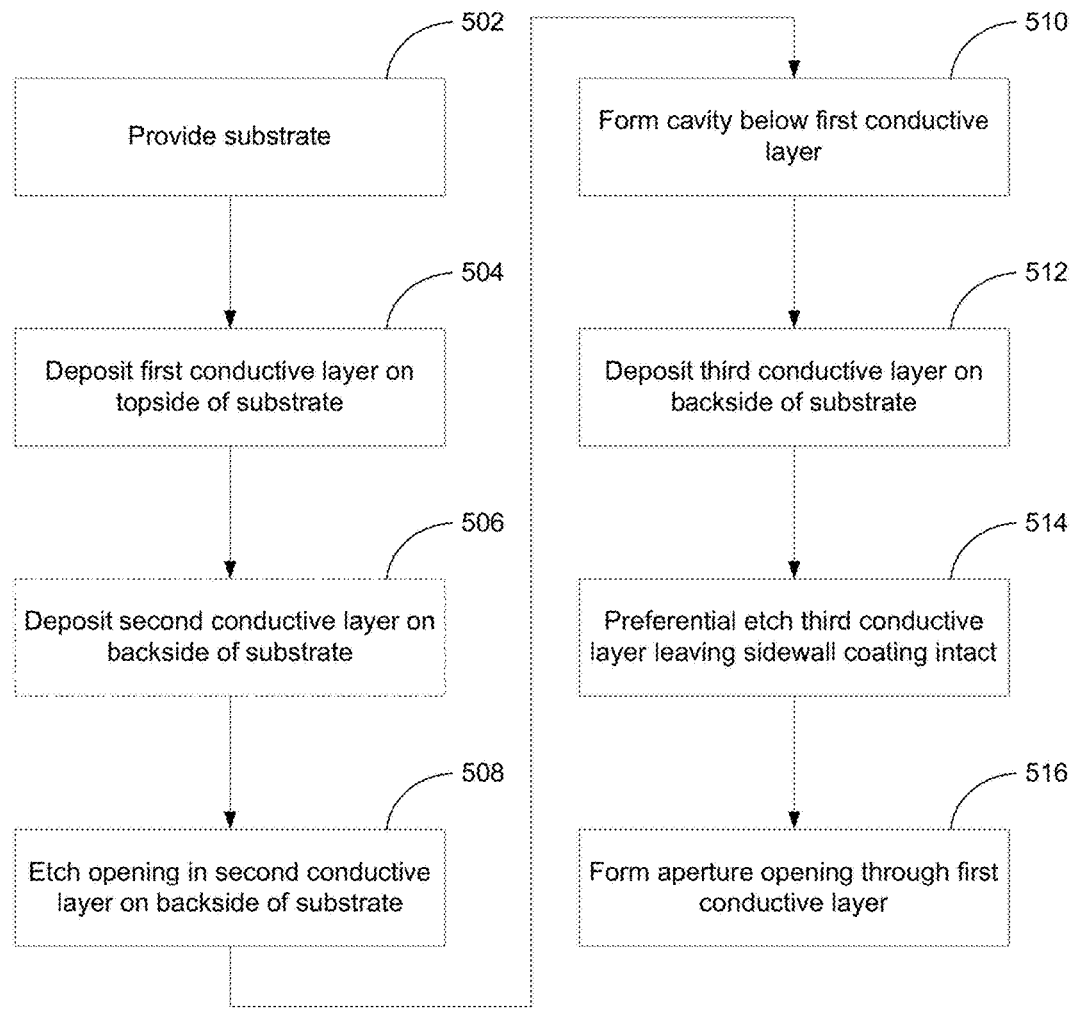
FIG. 5 is a flow chart showing another method of making an aperture.

FIG. 5 is a flowchart showing a second preferred fabrication method of making an aperture structure. FIGS. 6A-6H illustrates the steps of the flowchart in FIG. 5.

Figure 6A:
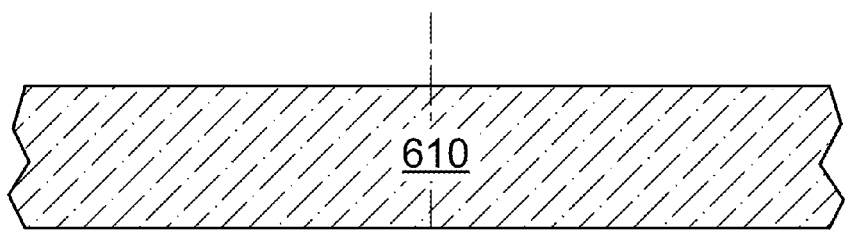

In step 502, a substrate, such as a silicon wafer, is provided. FIG. 6A shows a silicon substrate, preferably a single crystal silicon wafer 610. Preferably, the substrate is polished on both sides in order to facilitate layer deposition and eventual mounting of the die to an aperture rod or mounting device. The wafer thickness is not significant, so different wafer diameters may be used.

Figure 6B:
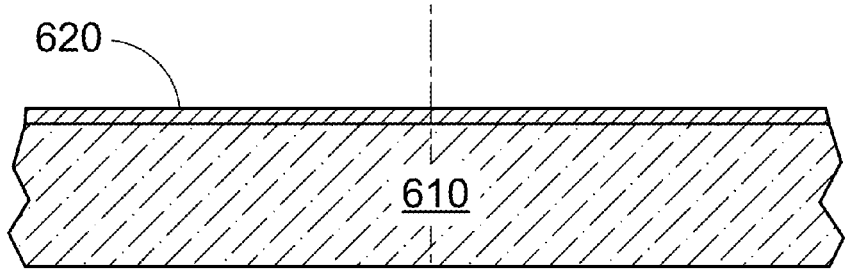
Figure 6C:
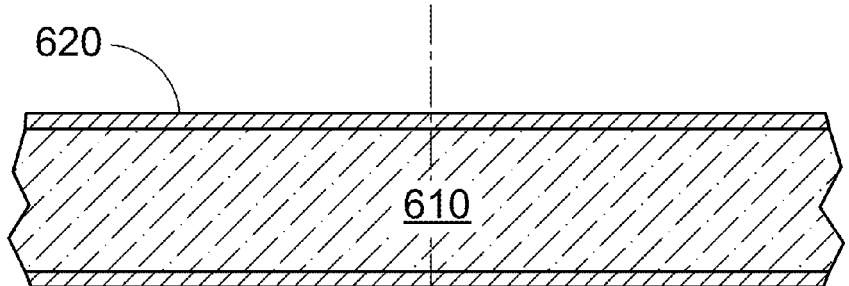
Figure 6D:
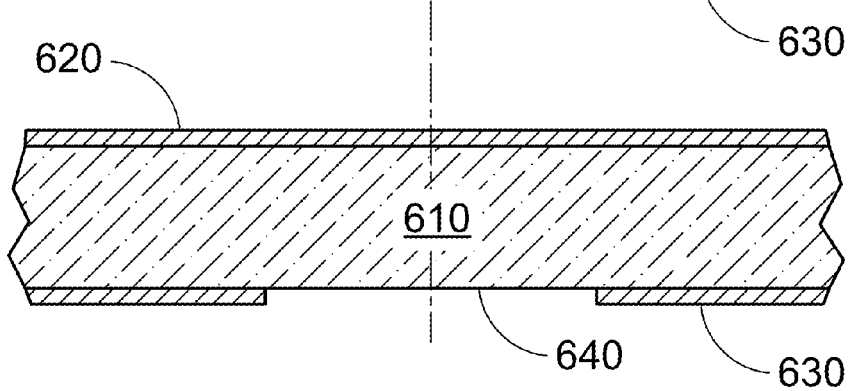

In step 504, a first conductive coating is deposited onto the top surface of the wafer 610, as shown in FIG. 6B. The first conductive coating can be deposited by the methods described above with respect to step 302 and can be composed of the same or similar materials as layer 420. The first conductive coating is preferably comprises a layer of molybdenum about 8 µm to 10 µm thick. Note that this deposition is thicker than the deposition of the conductive coating 420 of FIG. 4B because for this fabrication method, the final aperture opening defining region is comprised solely of the first molybdenum coating 620 material, not combined (or formed as a laminate of) first and second deposited conductive coatings 420 and 440 respectively of FIGS. 4D and 4E. A slightly tensile film is preferred to avoid buckling across the cavity opening.

In optional step 506, a second conductive coating 630 (FIG. 6C) is applied to the bottom surface of the wafer 610, the side opposite of the first conductive coating 620. The materials of the second conductive layer can be, for example, those described with respect to the first conductive layer. In one embodiment, both the first and second conductive layers comprise molybdenum, the second conductive layer approximately 4 µm to 5 µm thick. Any deposition method, such as the ones described above, can be used. A slightly tensile film is preferred to avoid buckling across the cavity opening.

In step 508, an opening 640 is etched into the second conductive coating 630 by lithographic patterning and subsequent first DRIE molybdenum etch. The resulting opening 640 is preferably about 1.0 mm in diameter in this embodiment and preferably serves as a hard mask for a second etch, such as a DRIE etch, in step 510.

FIG. 6E shows the result of the etch process in step 510 forming a cavity 650 in the wafer 610 from the bottom side, using the conductive coating 630 on the bottom surface as a mask, forming cavity 650 into the wafer below conductive layer 620 and exposing the backside of a portion of conductive layer 620 as shown in FIG. 6E. The exposed portion of conductive layer 620 is referred to as the aperture opening defining portion 632. The aperture opening defining portion 632 may be the exposed portion of multiple conductive layers formed as a laminate. The cavity 650 size of the cavity is determined by the size of opening 640 and is preferably about 1.0 mm in diameter. The first molybdenum layer 620 serves as the etch stop, thus the silicon etch proceeds to completion, ensuring that the bottom of the cavity is entirely molybdenum.

In step 512, a third conductive layer 660 as shown in FIG. 6F, preferably molybdenum, is deposited from the back side of the wafer 610, coating the conductive layer 630, the walls of the etched cavity 650 in the substrate, and the bottom surface of conductive layer 620. A slightly tensile film is preferred to avoid buckling across the cavity opening.

In step 514, an anisotropic etch is applied to preferentially remove the third conductive layers from the back surface of the wafer 610 and from the bottom surface of conductive layer 620, while leaving a substantial portion of molybdenum remaining on the walls 670 of the cavity 650. The result of this step is that the conductive layer 620 from the first molybdenum deposition remains substantially intact, cantilevered across the cavity 650 as shown in FIG. 6G. Thus the deposited thickness of layer 620 must be adequate to serve as an aperture. It is preferred, although not required in all embodiments, that the substrate 610 be entirely encapsulated on all sides, including the side walls of cavity 650, by a protective layer of molybdenum or another metal since some processing steps may involve the use of $XeF_2$, which will spontaneously attack and etch any exposed silicon surfaces.

In step 516, a hole is formed in layer 620 to form an aperture opening 680 as shown in FIG. 6H. The hole may be formed, for example, by photolithography or ion beam milling. The aperture opening 680 extends through the molybdenum layer 620 from the first molybdenum deposition, with a thickness between 8 and 10 µm.

The size and shape of the aperture will vary with the requirements of the charged particle beam system. Apertures opening diameters typically vary from a few microns to hundreds of microns. The aperture opening is smaller than the diameter of the cavity, the charged particles are unaffected by the substrate. The diameter of the aperture opening is preferably less than 0.8 times the cavity diameter, more preferably less than 0.5 the cavity diameter, and most preferably less than 0.1 times the cavity diameter. In some embodiments, the aperture opening shape is elliptical or oval. When the aperture opening is not circular, the longest linear diameter of the aperture opening, normal to the substrate surface, is preferably less than 0.8 times the shortest linear dimension of the cavity normal to the substrate surface, more preferably less than 0.5 the shortest linear dimension of the cavity normal to the substrate surface, and most preferably less than 0.1 times the shortest linear dimension of the cavity normal to the substrate surface. The term "diameter" is used to refer to any major linear dimension of the opening, normal to the beam axis. The substrate is typically more than five times thicker than the aperture opening portion, more than 10 times thicker than the aperture opening portion, or more than 20 timers thicker than the aperture opening portion. In some embodiments, the aperture opening shape is a rectangular slit. Example widths of the aperture slit can be in the range from 1.0-3.0 µm with lengths around 500 µm.

Figure 7:
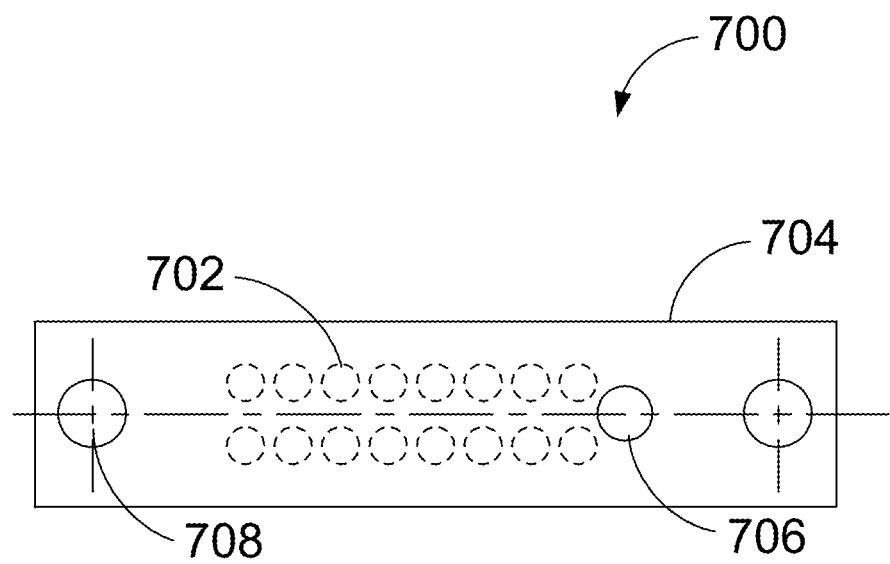
FIG. 7 shows an aperture strip fabricated in accordance with steps of FIG. 3 or FIG. 5.

FIG. 7 shows an aperture strip 700 consisting of two rows with eight apertures 702 in each row. Aperture strip 700 includes sixteen cavities etched into the substrate 704. A through hole 706 located at the end of the aperture array enables the charged particle beam system operation effectively with no aperture blocking the beam—this hole also serves as a marker for the proper aperture strip orientation in the aperture motions assembly. An orientation marker 708 is etched into both sides of the aperture strip.

In another embodiment, aperture strips are selectively fabricated such that two or more aperture opening defining portion thicknesses are formed within the same aperture strip. In other words, the conductive coating thickness formed at the aperture opening can be different for one or more apertures within the same aperture strip thereby allowing a constant aspect ratio of apertures of different thicknesses to remain the same. As the diameter of the aperture opening gets larger, the thickness can also get larger to maintain a constant ratio of diameter to thickness.

Figure 8:
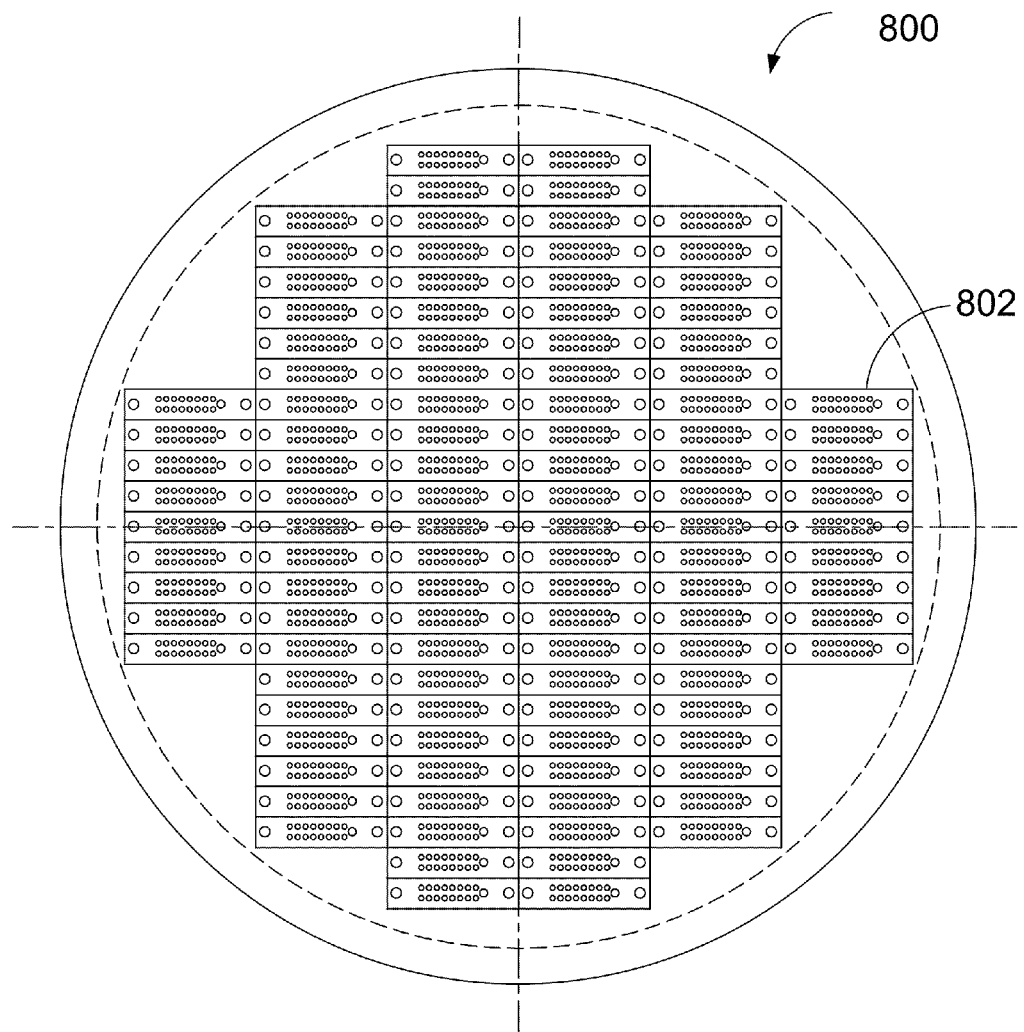
FIG. 8 shows an example layout of wafer on which are fabricated multiple apertures stripes similar to those shown in FIG. 7.

FIG. 8 shows an example layout 800 of one hundred ten aperture dice 802 (see FIG. 7) arranged on a 150 mm diameter wafer. The kerf or scribe alley widths are not shown, but there is adequate edge exclusion to account for any necessary kerf widths without needing to change the layout. Any size wafer can be used in the fabrication process of the aperture strip.

Although the present invention and its advantages have been described in detail, it should be understood that various changes, substitutions and alterations can be made herein without departing from the spirit and scope of the invention as defined by the appended claims. For example, while the embodiments describe one aperture opening per substrate cavity, some embodiments could have multiple aperture openings per cavity. For example, a long, thin cavity could include multiple aperture openings. Coating the sides of the cavity with a conductor may be unnecessary in some embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. An aperture structure for a charged particle beam system, the aperture structure comprising:
   a substrate;
   an aperture material supported by the substrate and having an aperture opening defining portion, the aperture opening defining portion comprised solely of the aperture material and including a hole defining an aperture opening; and
   a cavity in the substrate,
   wherein the cavity is under the aperture opening defining portion and a diameter of the aperture opening is smaller than a diameter of the cavity such that:
      the aperture opening is defined by the hole and not by the cavity in the substrate, and
      a charged particle beam passing through the aperture opening would not be affected by the substrate.

2. The aperture structure of claim 1 in which the substrate comprises a semiconductor and the aperture material comprises a conductor.

3. The aperture structure of claim 2 in which the substrate comprises silicon and the aperture material comprises molybdenum, tungsten, titanium, platinum, graphite or conducting diamond.

4. The aperture structure of claim 1 in which the substrate is more than 10 times thicker than the aperture opening defining portion.

5. The aperture structure of claim 1 in which a shortest linear dimension of the cavity in the substrate below the aperture opening defining portion that is normal to a surface of the substrate is at least ten times a longest linear dimension of the aperture opening that is normal to a surface of the substrate.

6. The aperture structure of claim 1 in which a closest distance from the material of the substrate to the aperture opening is ten times a diameter of the aperture opening.

7. An aperture strip comprising at least two of the aperture structures of claim 1 on a common substrate.

8. A charged particle beam column, comprising:
   a source of charged particles; and
   a focusing column for focusing the charged particles, the focusing column including the aperture strip of claim 7.

9. A method for fabricating a beam-defining aperture, comprising:
   depositing a first conductive layer on a top side of a substrate;
   forming a cavity on a bottom side of the substrate which exposes a portion of a bottom side of the first conductive layer; and
   forming a hole in a portion of the first conductive layer cantilevered over the cavity, the hole opening into the cavity such that a beam-defining aperture defined by the hole is determined by the patterning on the first conductive layer and not by a size of the cavity.

10. The method of claim 9 further comprising depositing a second conductive layer on the bottom side of the substrate such that a wall of the cavity and the bottom side of the first conductive layer are coated.

11. The method of claim 9 in which depositing a first conductive layer comprises depositing molybdenum.

12. The method of claim 9 in which depositing a first conductive layer comprises depositing tungsten, titanium, platinum, graphite or conducting diamond.

13. The method of claim 9 in which depositing a first conductive layer comprises depositing a tensile structure.

14. The method of claim 9 in which forming a cavity includes forming a cavity having a diameter of approximately 1 mm.

15. The method of claim 9 in which forming a hole in the conductive layer includes forming a hole in the form of a circle, oval, or rectangular slit.

16. A method for fabricating a beam-defining aperture strip, comprising:
   depositing a first conductive coating on a top side of a substrate;
   forming a plurality of cavities on a bottom side of the substrate, the cavities exposing a bottom side of the first conductive coating;
   forming aperture openings through the first conductive coating, above one or more of the cavities; and
   dividing the substrate into multiple aperture strips, each aperture strip comprising at least two of the aperture openings, wherein the at least two of the aperture openings have different diameters.

17. The method of claim 16 further comprising depositing a second conductive coating on the bottom side of the substrate such that walls of the cavities and the bottom side of the first conductive coating are coated.

18. The method of claim 16 in which the substrate comprises silicon and the first conductive coating comprises molybdenum, tungsten, titanium, platinum, graphite or conducting diamond.

19. The method of claim 16 in which longest linear dimensions of the aperture openings normal to a beam direction are less than 0.8 times longest linear dimensions of the cavities normal to the beam direction.

20. The method of claim 16 in which a thickness of the first conductive coating is less than five times a thickness of the substrate.

21. The method of claim 16 further comprising:
   forming a first aperture opening defining portion as a conductive laminate by depositing a second conductive coating onto a portion of the backside of the first conductive coating exposed by the formation of a first cavity of the plurality of cavities; and
   forming a first aperture opening through the first aperture opening defining portion,
   wherein a first thickness of the first aperture opening defining portion at the first aperture opening is different than a second thickness of a second aperture opening defining portion of a second aperture opening located above second cavity of the plurality of cavities, and wherein one of the multiple aperture strips comprises the first cavity and the second cavity.

\* \* \* \* \*